United States Patent
Helms

(10) Patent No.: US 7,039,755 B1
(45) Date of Patent: May 2, 2006

(54) METHOD AND APPARATUS FOR POWERING DOWN THE CPU/MEMORY CONTROLLER COMPLEX WHILE PRESERVING THE SELF REFRESH STATE OF MEMORY IN THE SYSTEM

(75) Inventor: Frank P. Helms, Round Rock, TX (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 1030 days.

(21) Appl. No.: 09/584,301

(22) Filed: May 31, 2000

(51) Int. Cl.
*G11C 11/406* (2006.01)
*G06F 12/16* (2006.01)

(52) U.S. Cl. ............................... 711/106; 365/222
(58) Field of Classification Search ................ 711/106, 711/105; 395/433; 365/222
See application file for complete search history.

(56) References Cited

U.S. PATENT DOCUMENTS

| | | | | |
|---|---|---|---|---|
| 5,630,090 A | * | 5/1997 | Keehn et al. | 711/106 |
| 5,940,851 A | * | 8/1999 | Leung | 711/106 |
| 6,212,599 B1 | * | 4/2001 | Baweja et al. | 711/106 |
| 6,330,639 B1 | * | 12/2001 | Fanning et al. | 711/106 |
| 6,654,895 B1 | * | 11/2003 | Henkhaus et al. | 713/320 |

OTHER PUBLICATIONS

AMBA Interconnection Schemes, Application Note 05, ARM DAI 0005A, 1998, pp. 1-2, 1-3, and 3-2.*
Intel Microsoft Toshiba, "Advanced Configuration and Power Interface Specification", Revision 1.0b, Feb. 2, 1999, pp. 1-397 (particularly Chapters 1-4).
Samsung Electronics, "DDR SDRAM Specification Version 0.4", Rev. 0.4 Jul. 1, 1999, pp. 1-49.

\* cited by examiner

*Primary Examiner*—Gary Portka
(74) *Attorney, Agent, or Firm*—Zagorin O'Brien Graham LLP

(57) ABSTRACT

Power management logic maintains memory in a computer system in the self refresh state during a power savings state in which power is removed from the memory controller. A memory control circuit, separate from the power management logic, controls the memory during other operational modes. The power management logic maintains the system memory in the self refresh state by driving memory control signal(s) at appropriate values during the power savings state.

21 Claims, 7 Drawing Sheets

METHOD AND APPARATUS FOR POWERING DOWN THE CPU/MEMORY CONTROLLER COMPLEX WHILE PRESERVING THE SELF REFRESH STATE OF MEMORY IN THE SYSTEM

BACKGROUND OF THE INVENTION

1. Field of the Invention

This invention relates to control of system memory and more particularly to maintaining system memory in a self refresh state during a power savings state in which power is removed from the memory controller.

2. Description of the Related Art

In order to save power during various power savings states in personal computer systems, it is common to shut down power being supplied to substantial portions of some or all of the integrated circuits in the computer system. Various power management and configuration mechanisms are defined by the Advanced Configuration and Power Interface (ACPI) specification, Revision 1.0b, dated Feb. 2, 1999, which is incorporated herein by reference.

The ACPI specification defines global system operating states G0, G1, G2 and G3. G0 is a working state, G1 is a sleeping state, G2 is a soft off state and G3 is a mechanical off state. In the G1 sleeping state, the computer consumes a small amount of power, and the system appears to be off to the user, e.g., the display is off. However, the system can be restarted without rebooting the operating system (OS) because a sufficient portion of the system context has been saved. Within the G1 sleeping state, the ACPI specification defines a number of sleep states S1–S3. The S1 state is a low wake-up latency state in which system context is not lost. A low wake-up latency means that the system returns to normal operation from the sleep state within a short time, e.g., less than 1 second. The S2 sleep is also a low wake-up latency state, however, CPU and cache context is lost and thus needs to be restored during the resume operation. In the S3 state, the system memory remains powered up and system context, e.g., the contents of processor registers and other system devices, are stored in system memory. The S3 state is also referred to as the suspend-to-RAM state. The wake-up latency from the S3 state is on the order of 3–5 seconds. The S4 state (suspend to disk) is the lowest power and longest latency state in which system context is stored in non volatile storage such as the system hard disk. Wake-up latency can be on the order of 8 or more seconds.

Referring to FIG. 1, an exemplary prior art computer system 100 is shown, which includes CPU 101, north bridge 102, south bridge 103 and system memory 104. The north bridge connects to CPU 101 via host bus 105. The north bridge provides a bridge function between the host bus and peripheral component interconnect (PCI) bus 107. The north bridge also provides the memory control function for system memory 104. Other parts of the computer system include a graphics card 109 and various PCI devices 111.

When the system enters the S3 sleep state, the entire CPU 101 and portions of north bridge 102 are shut down. However, at least a portion of north bridge 102 needs to be kept powered up to keep system memory in self refresh mode. Specifically, during the S3 state, system memory needs to be kept in self refresh mode to avoid system context being lost (since it is dynamic random access memory (DRAM)). Thus, at least the portion of the north bridge interfacing with the system memory 104 has to be maintained powered up in the S3 state to ensure system memory remains in self refresh mode.

In one prior art approach, illustrated in FIG. 1, north bridge 102 is divided into a plurality of different power planes, which each power plane providing voltage for a specific function. For example, a separate 3.3 V power plane 112 is provided for the Accelerated Graphics Port (AGP) interface, a 1.6 V power plane 114 is provided to interface to host bus 105, a 3.3 V power plane 116 provides power to PCI bus 107 interface, a 2.5 V power plane 118 provides power to interface to system memory 104 and a separate 2.5V core logic power plane 120 provides power for the core logic of north bridge 102.

During a power savings mode, typically the core logic power plane 120 is powered down along with those power planes not needed to control logic that remains powered up during the particular sleep state. However, 2.5 V power plane 118 needs to be maintained powered up to keep memory control signals at appropriate levels to ensure the DRAM in system memory 104 is refreshed during the sleep state.

Because certain printed circuit boards (PCBs), especially those used in desktop computers are limited to four wiring layers, it can be difficult to partition the power plane to support all of the power rails to the north bridge in a manner that follows good design practice. Accordingly, one solution is to provide a single 2.5 V power rail for both the core and the system memory interface. However, that limits the amount of power savings that can be achieved since a large portion of north bridge 102 has to remain powered up during suspend to RAM state to maintain system memory 104 in self refresh state. That can increase the S3 state power consumption.

An additional factor to be considered is that integrated circuits having multiple power planes have added design and test complexity. For example, the interfaces between the power planes require additional logic to ensure that signals coming from power planes that are powered down and going to power planes that are powered up, are forced to a known state when entering the power plane that is powered up. Also, signals being provided from logic that is powered into logic that is not powered, should be driven low.

It would be desirable to have a power savings approach that can maximize the amount of power that can be saved during sleep states without resulting in additional power planes. Further, it would be desirable to limit the number of power planes on a chip to minimize the additional logic required for signals crossing power plane boundaries.

SUMMARY OF THE INVENTION

Accordingly, the invention uses messaging or signal hand-shaking between an integrated circuit (such as the north bridge), that contains the system memory controller, and the integrated circuit that contains the system/power management logic (such as the south bridge) to allow the system memory to be maintained in a self-refresh state while the integrated circuit that contains the system memory controller is completely powered down.

In one embodiment, the invention provides a method for controlling the self refresh state of memory in a computer system. The method includes controlling at least one memory control signal being supplied to the memory from a first integrated circuit in the computer system according to an operational state of the system (e.g. during a normal run state) and controlling the memory control signal from another location (e.g., power management logic) in the computer system when the computer system is in a power savings state.

In another embodiment, the invention provides a computer system that includes a system memory capable of operating in a self refresh state. The system memory is coupled to receive at least one memory control signal, which is required to be held at a first value during the self refresh state. A memory control circuit is coupled to the system memory to provide the at least one memory control signal during an operational state and a second circuit, is coupled to cause the memory control signal to be at the first value during a power savings state.

In still another embodiment, the invention provides a method for controlling a self refresh state of a memory in a computer system that includes controlling at least one memory control signal being supplied to the memory from a first region in an integrated circuit during an operational state. The method further includes controlling at least one memory control signal from another location in the integrated circuit during a power savings state in which the first region is not powered, to maintain memory in the self refresh state.

BRIEF DESCRIPTION OF THE DRAWINGS

The present invention may be better understood, and its numerous objects, features, and advantages made apparent to those skilled in the art by referencing the accompanying drawings wherein the use of the same reference symbols in different drawings indicates similar or identical items.

DESCRIPTION OF THE PREFERRED EMBODIMENT(S)

Figure 1:
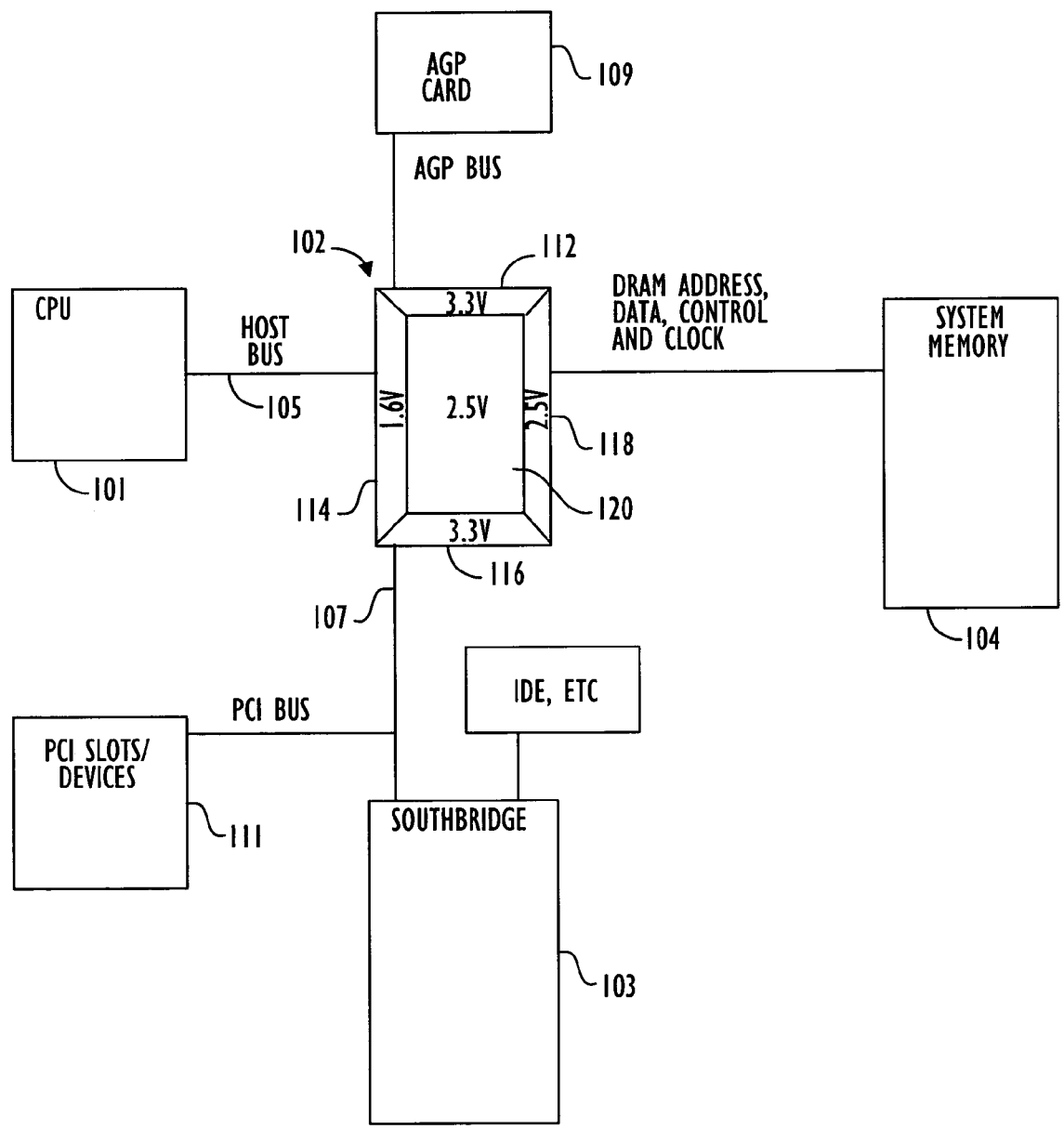
FIG. 1 illustrates a prior art computer system approach for controlling the system memory interface during a suspend to RAM power savings state.
Figure 2:
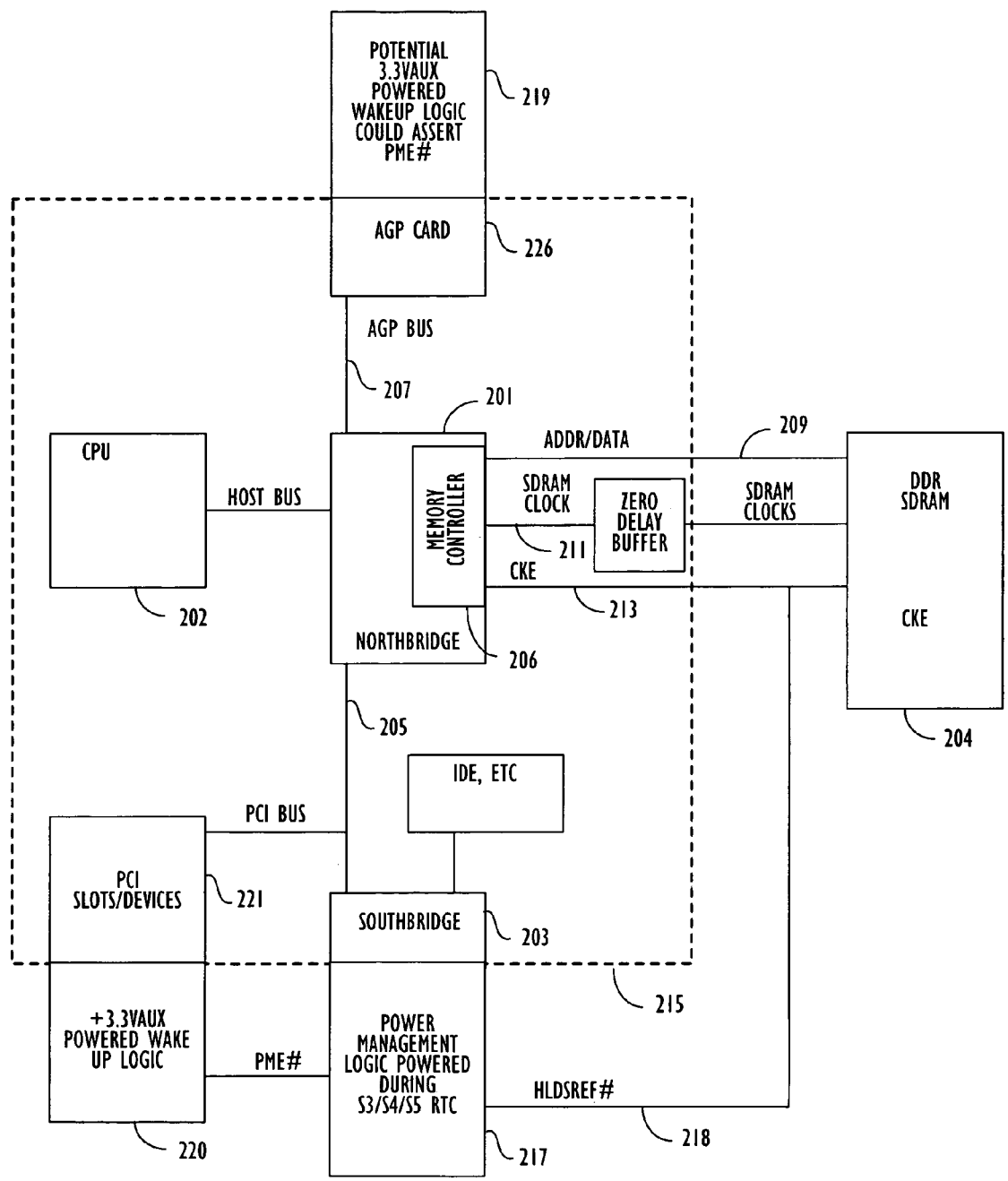
FIG. 2 illustrates one embodiment of the invention for driving the CKE signal from a separate location during the S3 state.

Referring to FIG. 2, one embodiment of the invention is illustrated. North bridge 201 incorporates memory controller 206 for controlling system memory 204. The computer system, in the embodiment shown in FIG. 2 needs to keep main system memory 204 refreshed during the S3 sleep state when most of the other system devices are powered off. That can be accomplished using self refresh modes available in current DRAM technologies as described further herein. In the embodiment illustrated, the self refresh state is maintained by holding the clock enable signal (CKE) 213 at a zero value. The DRAMS utilized in system memory 204 may be double data rate synchronous DRAMs (DDR SDRAMs) such as the 256 Mbyte DDR SDRAM described in DDR SDRAM Specification Version 0.4 dated Jul. 1, 1999 available from Samsung Electronics.

North bridge 201 also connects to CPU 202, PCI Bus 205 and AGP bus 207. Memory controller 206 in north bridge 201 provides the data and control signals to system memory 204. The signals include address/data lines 209, clock 211 and clock enable signal (CKE) 213. Other control lines which may also be supplied to system memory 204, e.g., RAS and CAS, are not shown to simplify the drawing.

When the system is placed in an S3 sleep modes, the logic within dotted lines 215 is powered down. In the embodiment shown, that includes shutting down power planes supplying +5V, +3.3V, +12 V and Vcc for CPU 202. Logic outside of dotted lines 215 is powered by 3.3V SUS or +5 SUS during the S3 sleep state. The power button logic is powered by standby voltage +5V STBY/+3V STBY. SUS power planes, also referred to as dual planes, supply high currents during the S0 state and low currents during the S3 state. STBY voltages supply only low currents in any power state. In desktop PCs, which use "ATX" power supplies, the SUS or dual planes are derived from the main ATX outputs during S0 and S1 states and are derived from STBY output during S3 or deeper sleep states. Additionally, portion 217 of south bridge 203, which remains powered up during S3, is powered by the SUS or STBY voltage. Generally, only the Real Time Clock (RTC) is powered by the RTC battery when no other power source is present.

In the embodiment shown in FIG. 2, the power planes are partitioned such that a majority of the logic is powered off during the S3 state, as described. However, system memory 204 and logic required to wake the system, such as portion 217 of south bridge 203, portion 219 of graphics card 226 and portion 220 of the PCI devices 221, remain powered during the S3 state. The exemplary computer system in FIG. 2 may use a power supply that works with the partitioned power planes such an ATX type power supply and logic/ FETs on the motherboard to create voltage rails with the desired characteristics described in the tables 1 and 2 below.

The power planes of an exemplary desktop system are described in Table 1. Note that the power planes for a notebook system may be different since power is sourced from a battery or other power supply rather than, e.g., a standard ATX desktop type power supply.

TABLE 1

| Voltage plane | Source | What it is used for |
|---|---|---|
| +5 VSTBY | Standard ATX power supply output | Creation of +3 VSTBY, +5 VDUAL, and to power any +5 V logic that is powered during S4 (suspend to disk) or S5 (soft off). |
| +3 VSTBY | This is +3.3 V power rail is derived from +5 VSTBY on the motherboard | |
| +3.3 V | Standard ATX power supply output | Powers logic used in G0 and S1 |
| +5 V | Standard ATX power supply output | Powers logic used in G0 and S1 |
| +3.3 VSUS also called 3.3 VDUAL | This +3.3 V rail is derived from +3.3 V and +3 VSTBY. | Powers the logic that is powered during the S3 sleep state including: 1) Powers the system memory (SDRAM) 2) +3.3 VAUX on the PCI connectors for wake on LAN etc. |
| +5 VSUS | This +5 V rail is derived | Powers any logic that |

TABLE 1-continued

| Voltage plane | Source | What it is used for |
|---|---|---|
| also called +5 V DUAL | from main 5 V output of ATX power supply and +5 VSTBY. | remains powered during S3 (Suspend to RAM) |
| CPUVCC | This voltage rail is derived from the +5 V output of the ATX power supply | Powers CPU during the working state and the S1 sleep state. Is powered off during S3 and deeper sleep states. |
| +12 V | Standard ATX power supply output | Powers logic used in G0 and S1 |
| +12 VSTBY | This +12 V power rail is derived from the +5 VSTBY power rail for desktop PCs. | |

Table 2 illustrates which components in the computer system shown in FIG. 2 are active in the S3 state. The information shown in Tables 1 and 2 is exemplary only. The actual voltages, power rails and use depends on system implementation. In addition, many of the voltages shown are decreasing as process geometries continue to decrease. Note that for double data rate (DDR) synchronous DRAM, voltage may be 2.5 V. In desktop system, the dual planes (SUS) may be powered in S0–S5 states.

TABLE 2

| Component | Power rails | Powered during S3? |
|---|---|---|
| CPU | CPUVCC | No |
| North Bridge | +3.3 V or 2.5 V | No |
| System Memory | +3.3 VSUS or 2.5 V | Yes |
| South Bridge | +3.3 V, +3.3 VSUS | Only the Resume well. |
| PCI devices | +3.3 V, +3.3 VSUS, +5 V | Only the +3.3 VAUX resume well logic on the PCI card is powered during S3. +3.3 VSUS or STBY may be routed to the +3.3 VAUX pin on the PCI connectors. |
| AGP device | +3.3 V, +3.3 VSUS, +5 V, +12 V, +1.5 V | Only the +3.3 VAUX resume well logic on the AGP card is powered during S3. +3.3 VSUS is routed to the +3.3 VAUX pin on the PCI connectors. |
| Peripherals: FDD, HDD, CD-ROM, DVD, FANS | +5 V, +12 V | No |

Referring again to FIG. 2, the memory controller in north bridge 201 puts the SDRAM in system memory 204 in self refresh mode when an event causing the S3 sleep state occurs. An exemplary sequence of events to place system memory in the self refresh mode (as described in DDR SDRAM Specification Version 0.4 dated Jul. 1, 1999 available from Samsung Electronics) is as follows. A self refresh command is defined by having Chip Select (CS#) (the # indicating an active low signal), RAS#, CAS# and CKE held low with WE# high at the rising edge of the clock(CK). Once the self refresh command is initiated, CKE is held low to keep the device in self refresh mode. During the self refresh operation, all inputs except CKE are ignored.

Once the power management logic 217 in south bridge 203 determines that system memory 204 is in self refresh mode, it begins driving the control signal(s) needed to maintain system memory 204 in self refresh mode. In the embodiment shown, the power management logic drives the clock enable (CKE) signal 213 low. Once the power management logic 217 is driving signal hold self refresh (HLDSREF#) 218 low (the # sign indicating active low), the power planes supplying the area of the system within dashed lines 215 may be shut down. HLDSREF# is normally maintained in a high impedance state to allow memory controller 206 to control the logic level of the CKE signal. On wake-up, the power management ensures that the memory controller is again driving the CKE signal line inactive (low) before the power management logic stops driving the HLDSREF# line low and places the line back in a high impedance state to state allow the memory controller to drive the CKE signal.

In order to utilize the S3 suspend to RAM state, the system needs to have the ability to store the state of the system into main system memory 204. The operating system and device drivers primarily handle saving system context. The BIOS stores chipset configuration information during execution of the power on self test (POST) routine.

While in the S3 state, the system needs to be able to wake up in response to certain predefined events, e.g., network activity (wake on LAN), and restore the state of the computer system. Restoring the state of the system is done by a combination of the BIOS (restoring chipset configuration registers), the operating system, and device drivers in a manner known in the art.

Figure 3:
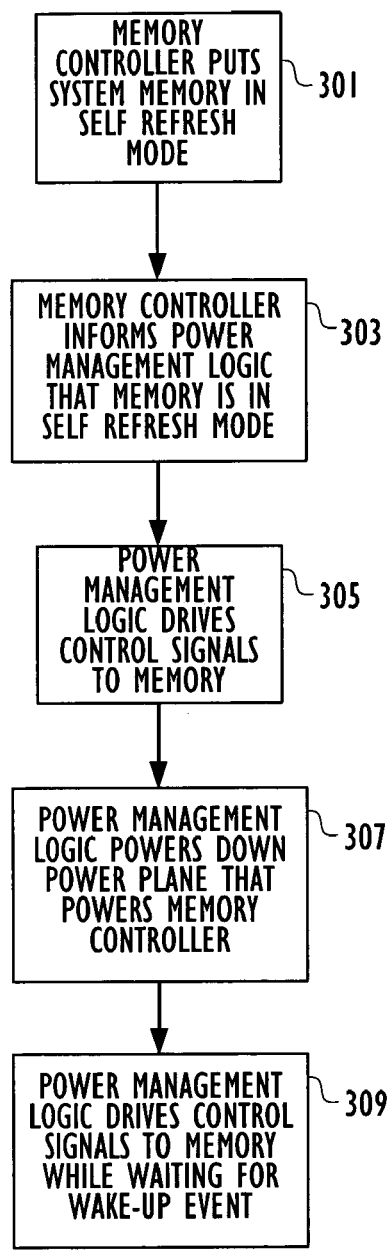
FIG. 3 illustrates a flow chart for entering the S3 state according to one embodiment of the invention.

Referring to FIG. 3, a flow chart illustrates the steps taken by the system to enter the S3 state with the north bridge (including the memory controller) being completely turned off and keep the system memory in a self refresh state.

When the power management system detects a condition, such as a prolonged period of inactivity, that causes it to enter the S3 state, the power management logic, located in the south bridge under software and/or hardware control informs the memory controller that it should put the system memory into the self refresh mode. In 301, the memory controller in the north bridge puts the system in self refresh mode. In 303 the memory controller informs the power management logic that the memory is in self-refresh mode. That indicates that the power management logic can drive the control signal(s) to the system memory low as described herein. In 305 the power management logic drives the control signal(s) (CKE) to the system memory low to hold the system memory in self-refresh mode. In 307 the power management logic then powers down the power plane that powers the integrated circuit that contains the memory controller. In the embodiment illustrated in FIG. 2, the memory controller is contained in north bridge 201.

The approach described herein has achieved increased power savings because the system memory is maintained in a self-refresh mode while most of the remainder of the system including the CPU and north bridge are powered down. CKE control inputs to the SDRAM are driven low by the south bridge so that they stay low during S3, and do not glitch high when the memory control is powered back on. Glitching the control line(s) high would bring the memory out of self-refresh mode, which is why these lines(s) need to be actively driven low.

Figure 4:
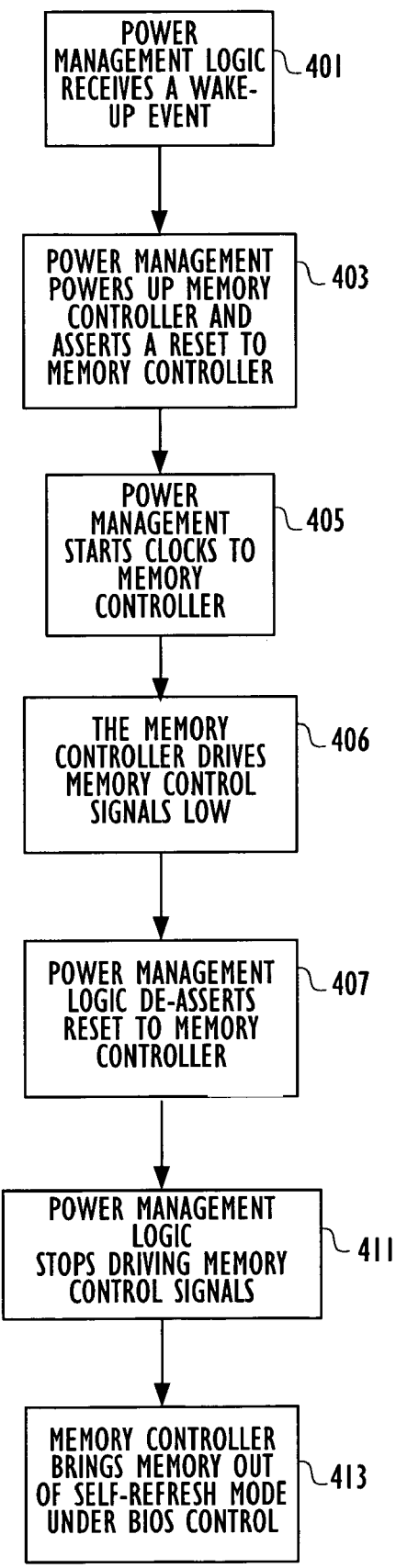
FIG. 4 illustrates a flow chart for returning to the operating state from the S3 state according to one embodiment of the invention.

The sequence of events, in one embodiment of the invention, to power the memory controller backup and return the memory and the computer system to the operational mode is illustrated in FIG. 4. In 401 the power management logic receives an indication of a wakeup event. That wakeup event may be sensed in the logic 217 or other logic that remains powered up in the S3 state. Once an indication of the wakeup event is received by the power management logic in south bridge 217 as shown in 403, the power management logic powers up the memory controller and asserts a reset to the memory controller. In 405 the power management logic starts clocks to the memory controller. In 406 the memory controller drives the memory control signals to an appropriate state (CKE signal(s) low). In 407 the power management logic de-asserts the reset to the memory controller which was maintained for a predetermined amount of time, long enough for the north bridge to enter a known state, which is its predefined reset state. Power management logic stops driving the CKE signals low in 411. The CPU 203 starts executing code for the resume sequence. Note that the memory control signals that need to be driven during the self refresh state may be one or more control signals. The Basic Input-Output System (BIOS) System Firmware 7P.4 May 26, 2000 causes the memory controller in 413 to bring the memory out of self-refresh mode. Once that is done, the system software can then restore context which has been stored in system memory 204.

In other embodiments, the power management logic could enable a tri-statable buffer to drive the various memory control signals low during the S3 suspend mode rather than driving the signals directly. That may be desirable if there are several control signals and it is desired to save pins on the south bridge integrated circuit containing the power management logic. As described further herein, the power management logic could isolate the memory from the memory controller with FET-switches during the suspend period. That could be advantageous if, e.g., some of the control signals on the memory are required to be held at a logic 1 during self-refresh mode. That can also be advantageous if the memory controller is not well behaved (e.g., in terms of voltage or current spikes) on powering back up.

Note that the handshakes between the memory controller and the power management logic, e.g., indicating when the memory control signals are being driven, can be achieved by commands over a bus, by discrete signals or by a combination of the two. The handshaking could all be triggered by a single initiating command, signal or event if the timing of the sequence of putting the memory into self-refresh, powering down the memory controller, powering the memory controller back up, and returning control of the memory control signals to the memory controller is a fixed, predetermined timing sequence.

In one embodiment, the north bridge drives the control signals chip select (CS#), RAS#, CAS# and CKE lines low and write enable (WE#) high to the DDR SDRAM whenever PCIRST# (the PCI Reset signal) (not shown) is asserted. In the presence of a rising edge of the SDRAM clock, that will be interpreted as the self refresh command as described previously. The DDR SDRAM requires that CKE be held low during power up. When the north bridge is powered up upon resume from the S3 state, it drives CKE low until initialized by the write to a configuration register to bring the SDRAM out of self refresh mode.

Before placing the DDR SDRAM into self refresh mode, the north bridge may first issue an auto refresh command and wait for it to complete, if required by the DDR SDRAM being utilized in system memory 204. In addition, the DDR SDRAM being used may require that north bridge 210 issue an auto refresh command and wait for it to complete after the self refresh mode is exited. Other commands, in addition to, or instead of some or all of the commands described herein, may be required by a DDR SDRAM to be placed into the self refresh state.

In one embodiment, north bridge 201 includes two memory control register bits that default to "00" when reset signal PCIRST# is asserted. When the bits are "00", that indicates that the north bridge should hold the DDR SDRAM interface control signals CS#, RAS#, CAS# and CKE lines low and WE# high. When the register bits are "01", that indicates the north bridge, and associated software should follow the DDR SDRAM manufacture's specification for power-up sequencing of the SDRAM and issue the auto refresh command. The BIOS programs these bits to "01" when the reset is part of sequencing the system out of the S4 (Suspend to Disk), S5 (Soft Off), or Mechanical Off states.

When the bits are "1x", the north bridge brings the SDRAM out of self refresh and issues the auto refresh command. The BIOS programs these bits to "10" when the system is resuming from the S3 (Suspend to RAM) state. For an exemplary DDR SDRAM, CKE should be maintained low during power on while the VDD rails to the SDRAM are being powered up, and CKE should be maintained low until the clock has been stable for a minimum of 200 microseconds. Also, issuing an "auto refresh" command may be required before issuing the self refresh command to enter self refresh mode and may be required after exiting self refresh mode depending on the memory device used.

The two register control memory bits are cleared by PCIRST# (or another appropriate reset signal), and bring the SDRAM out of self refresh mode the first time that a 1 is written to either bit after PCIRST# has been de-asserted. The reason that these bits are only used once after PCIRST# is de-asserted is that the memory controller must routinely bring the SDRAM out of self refresh mode when the C3 (a CPU power state for the G0 working state, which is defined in the ACPI specification) and S1 states are exited. The DRAM is in self refresh mode for power savings during those states. C3 is a very low power CPU state and S1 is a system sleep state. In one embodiment, the two register control memory bits determine when to bring the SDRAM out of self refresh after PCIRST# has been applied, so that BIOS can re-initialize the memory control registers in the north bridge before the DDR SDRAM is brought out of self-refresh. Note that the system provides storage to store the state of memory controller registers outside of the memory controller if the memory controller is powered off during S3.

Note that if only pulldown resistors are used to hold control signals low during suspend, then when the memory control integrated circuit is powered back up, there is a chance that the control signals will glitch and the memory can be brought out of self-refresh prematurely and corrupted.

Figure 5:
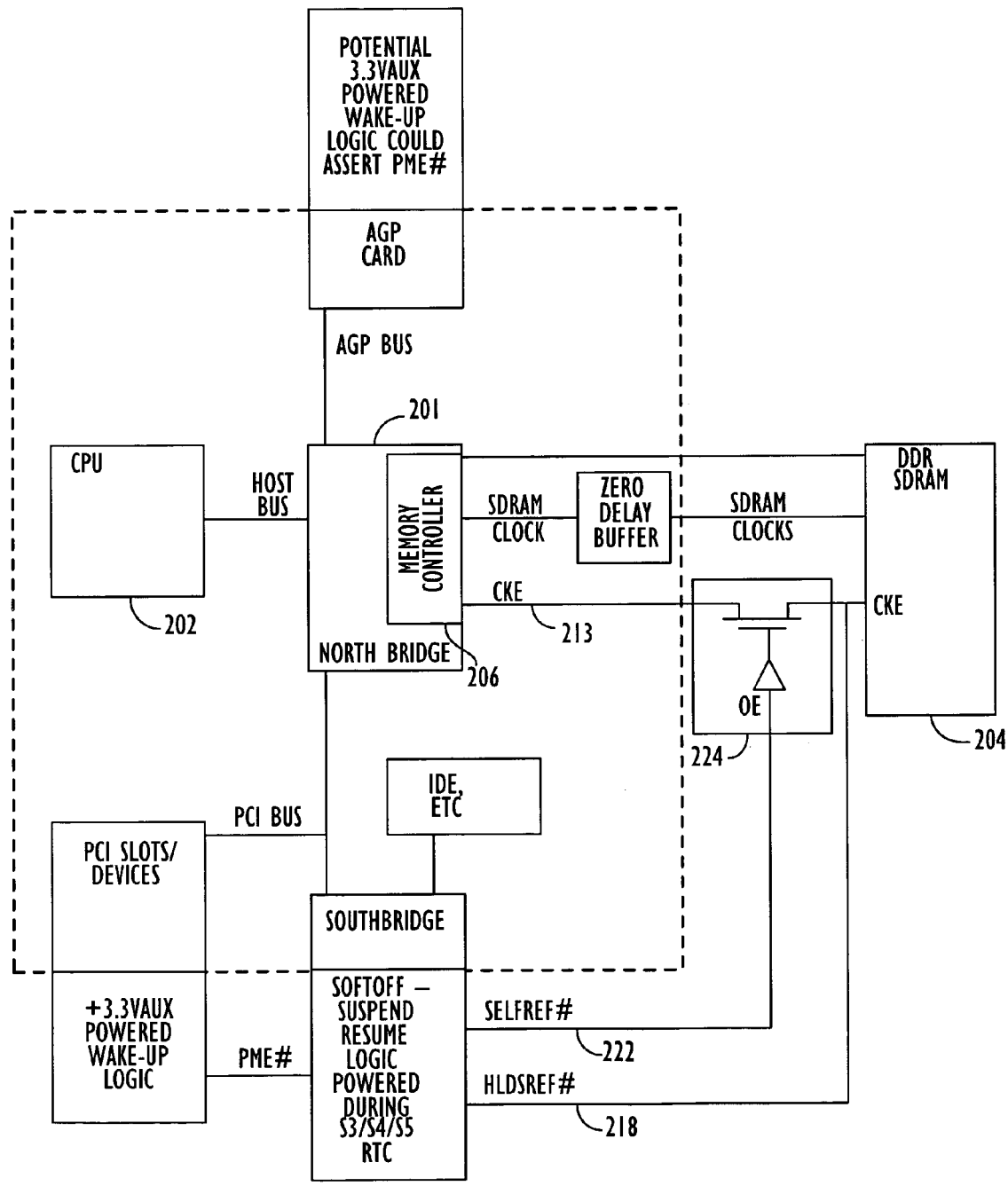
FIG. 5 illustrates a second embodiment for driving the CKE signal and isolating the north bridge from the CKE line being driven to system memory during the S3 state.

Referring to FIG. 5, another embodiment is illustrated that isolates memory controller 206 from memory 204 during the S3 state. The HLDSREF# output is an open drain output that is at high impedance except when driven low to hold the DDR SDRAM in the self refresh mode by maintaining the CKE input 213 to memory 204 low during the S3 state. In the illustrated embodiment, HLDSREF# is driven low by the south bridge in response to a stop grant cycle being placed on the PCI bus. The stop grant cycle is responsive to the STPCLK# being asserted when the Sleep type and enable bits are written to cause the hardware transition to the S3 state. HLDSREF# is placed in the high impedance state after SELFREF# is driven high during the resume from the S3 state.

The self refresh (SELFREF#) signal 222 output by the south bridge isolates the CKE output of the north bridge from the CKE input of the SDRAM when power is removed from the north bridge. SELFREF# is driven low to isolate memory controller 206 after HDLSREF# is driven low but before PCIRST# is asserted and before power is removed from the north bridge when the system is transitioning into an S3 sleep state. SELFREF# 222 is driven high when PCIRST# is driven high on resume from the S3 sleep state. SELFREF# controls the enable pin of switch 224, which may be a Quick Switch device like the Quality Semiconductor QS3VH126. If SELFREF# equals 1, switch 224 is enabled (north bridge 201 drives the CKE signal to the SDRAM). When SELFREF# is 0, the input and output of switch 224 are isolated, which isolates the north bridge from system memory 204.

The south bridge also supplies a control signal (not shown) to the power supply (not shown) to control the various power planes in the various run states. The power supply control signal is asserted to turn on all of the power planes that are powered on, during the G0/S0 working state and the S1 sleep state. The power supply control signal (RUNON# in one embodiment), is de-asserted to the power supply after PCIRST# is asserted on entry to the S3 and deeper sleep states to turn off the appropriate power planes described herein.

Figure 6:
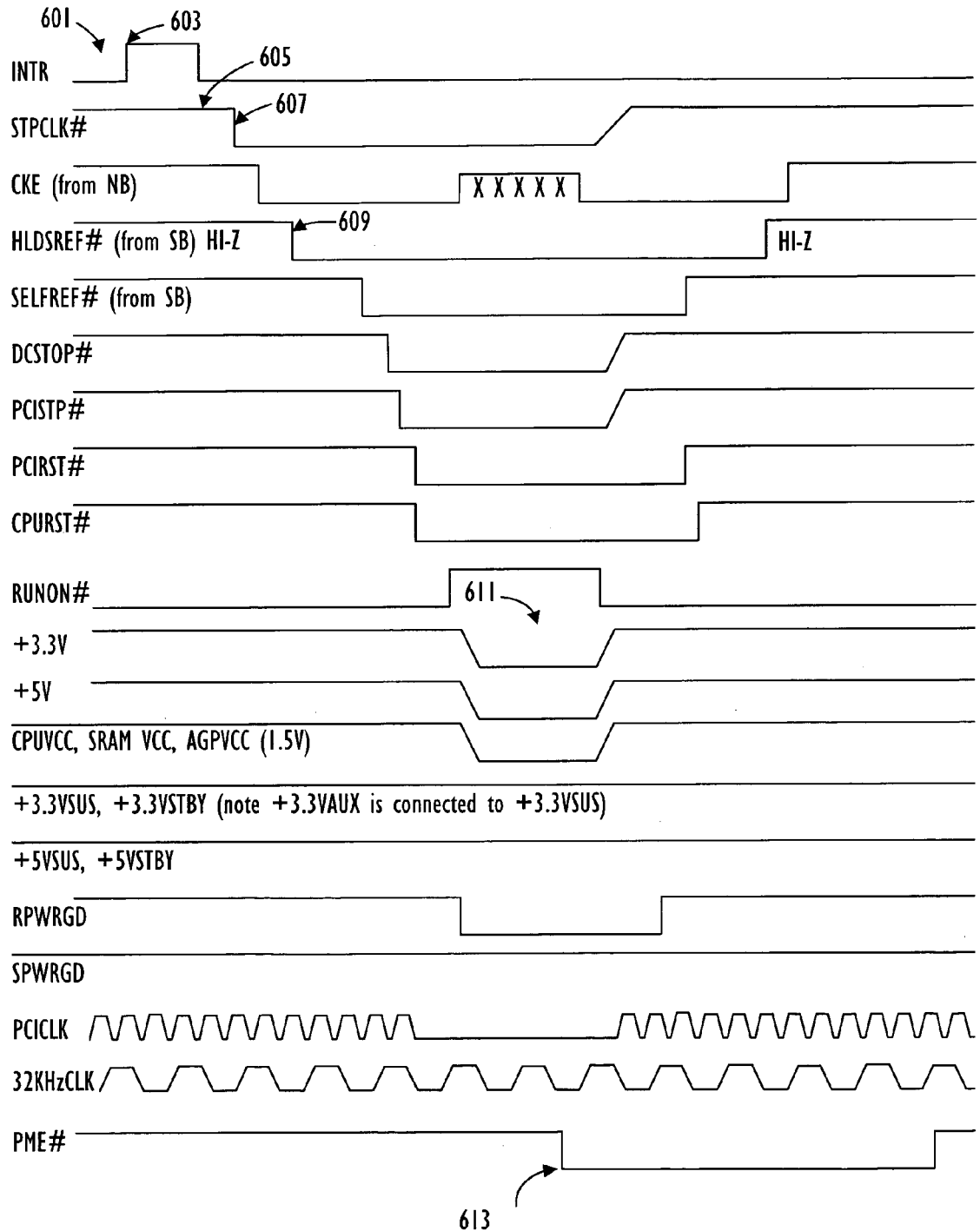
FIG. 6 is a timing diagram illustrating how the system shown in FIG. 5 utilizes the embodiments shown therein.

Referring to FIG. 6, a timing diagram illustrates transitioning from the S0 (Working) to S3 (Suspend to RAM) and back to the S0 state. The transition from the S0 (working) state to the S3 (Suspend to RAM) state works as follows. At point 601 in FIG. 6, the computer system is operating in the S0/G0 (working) state and an event occurs, such as a timer indicating an idle condition has existed for a predetermined amount of time, that causes an SCI (system control interrupt) to occur at 603. The processor is interrupted, and the operating system (OS) determines that the system should be placed into the S3 state. That could also happen as the result of Start->Shut Down->Standby, which is an operating system menuing sequence to put the system into a sleep state.

When the OS receives the SCI (INTR assertion), the OS calls the device drivers for all of the devices in the system and puts them into the D3 hot state (all device context is saved to RAM, and the device is ready to have its power removed). D3 is a low power device state in which the device cannot initiate activity.

At point 605, the processor caches have been flushed and the CPU context has been saved. The OS writes the Sleep Type and Sleep enable bits in a power management control register (the ACPI Fixed Feature Space PM1 Control Register) in the south bridge to initiate the hardware sequence that removes power from most of the devices in the system and completes the transition into the S3 state. As a result of the write to the Sleep Type and Sleep Enable bits, the south bridge asserts STPCLK# to the processor at 607.

When the processor recognizes that STPCLK# has been asserted, it initiates a disconnect with the north bridge. When the host bus disconnect is complete, the north bridge executes an auto refresh command to the DDR SDRAM and waits for the auto refresh command to complete. Next the north bridge issues the self refresh command to put the DDR SDRAM into self refresh mode (a sequence that includes driving the CKE line to the SDRAM low).

The north bridge issues a stop grant special cycle on the PCI bus, and the south bridge responds by driving HLD-SREF# low at 609. Up to this point HLDSREF# has been held at high impedance so that it will not interfere with north bridge control of the CKE signal to the SDRAM. After HLDSREF# has been driven low, the south bridge (or motherboard glue logic if necessary) drives SELFREF# low to isolate north bridge 201 from the CKE signal being driven to system memory 204. Next the south bridge sequences other power control pins including DCSTOP#, which when asserted causes the Northbridge to enter a low power state. PCISTP# can be used to stop the PCI bus clock but may not be used in some implementations. Then, the south bridge asserts PCIRST#, CPURST#. Note that the south bridge continues to drive PCIRST# low during the S3 state in support of +3.3VAUX logic on PCI devices that is used for resume from the S3 state.

Next the south bridge de-asserts RUNON#. If RUNON#=0, the power supply provides the +3.3V, +5V, +12V, −12V, and −5V (if used) power planes. If RUNON#=1, the power supply powers off those power planes that are powered down during the S3 and deeper sleep states (+3.3V, +5V, +12V, −12V, and −5V).

Once the power being supplied on the "RUN" planes (+3.3V, +5V, +12V, CPU VCC, −12V, −5V (if used), etc) is removed to the point that +3.3V, or +5V are out of spec by 10% (or other suitable percentage) RPWRGD (Run plane Power Good) will be de-asserted.

At 611 in FIG. 6, power is completely removed from the "RUN" planes and the system is in the S3 suspend to RAM state. The CKE line to the SDRAM is held low by HLD-SREF# and isolated from north bridge 201 (which is powered off) with switch 224 by holding SELFREF# low. Note that CKE from the northbridge may be indeterminate when voltage is removed and again when it is reapplied.

FIG. 6 also illustrates the transition from the S3 (Suspend to RAM) to S0 (Working state). At point 613 the system is in the S3 state and a wakeup event occurs (for example wake on LAN event, in which case the PCI LAN card asserts PME# to the south bridge). In response to the PME# signal, the south bridge (or motherboard logic) asserts RUNON# to power on the "RUN" planes (+3.3V, +5V, +12V, K7VCC, −12V, −5V (if used), etc). The south bridge maintains PCIRST#, SELFREF#, HLDSREF# asserted and asserts CPURST#. As the "RUN" planes power up, DCSTOP#, PCISTP# are driven inactive, and all of the clocks in the system begin running.

When the north bridge is powered enough to recognize that the PCIRST# input to the north bridge is asserted, the north bridge drives CKE to the SDRAM low. That is required because of the power-up sequencing requirements of the DDR SDRAM in addition to support for the S3 state.

Within several milliseconds of the "RUN" planes reaching 95% of their specified voltages, RPWRGD is asserted. When RPWRGD is asserted, the PCI Reset Pulse width count begins. When PCIRST# is de-asserted, SELFREF# is driven high. After SELFREF# is driven high, then HLD-SREF# is brought back into the high impedance state. CPURST# is de-asserted, the host bus is connected, and the CPU begins fetching power on self test (POST) code from the BIOS ROM.

After CPURST# is de-asserted, the BIOS determines that this is a resume from the S3 state rather than a reboot, and re-initializes the memory controller from memory that is nonvolatile during S3.

The last part of initializing the memory controller is to write the two control bits in the north bridge so that the north bridge will sequence the SDRAM out of self refresh mode. In one embodiment, those two bits are written to a 10 to indicate to the memory controller to bring the DDR SDRAM out of self refresh from the S3 state and to perform an auto refresh cycle.

After this the DDR SDRAM is out of self refresh mode and the BIOS can re-initialize the rest of the Chipset configuration registers (for north and south bridge) from the ACPI non-volatile storage memory area/ACPI Reserved memory area. After the BIOS has restored the chipset configuration register values, invalidated the caches, and restored the processor SMRAM base register, it passes control to the OS.

The OS then calls on drivers and runs appropriate software to complete the return of the system to the G0/S0 working state. While not specifically shown in the timing diagram, that occurs before the Power Management Event signal (PME#) goes away. Software drivers loaded by the operating system handle and clear PME#. The BIOS stores the memory controller configuration information to the "CMOS" RAM associated with the Real Time Clock (RTC) (or other appropriate non-volatile storage).

As described above, a computer system powers off normal memory control logic in the north bridge entirely and power management logic in the south bridge controls the system memory to maintain self refresh mode while in the S3 state.

Figure 7:
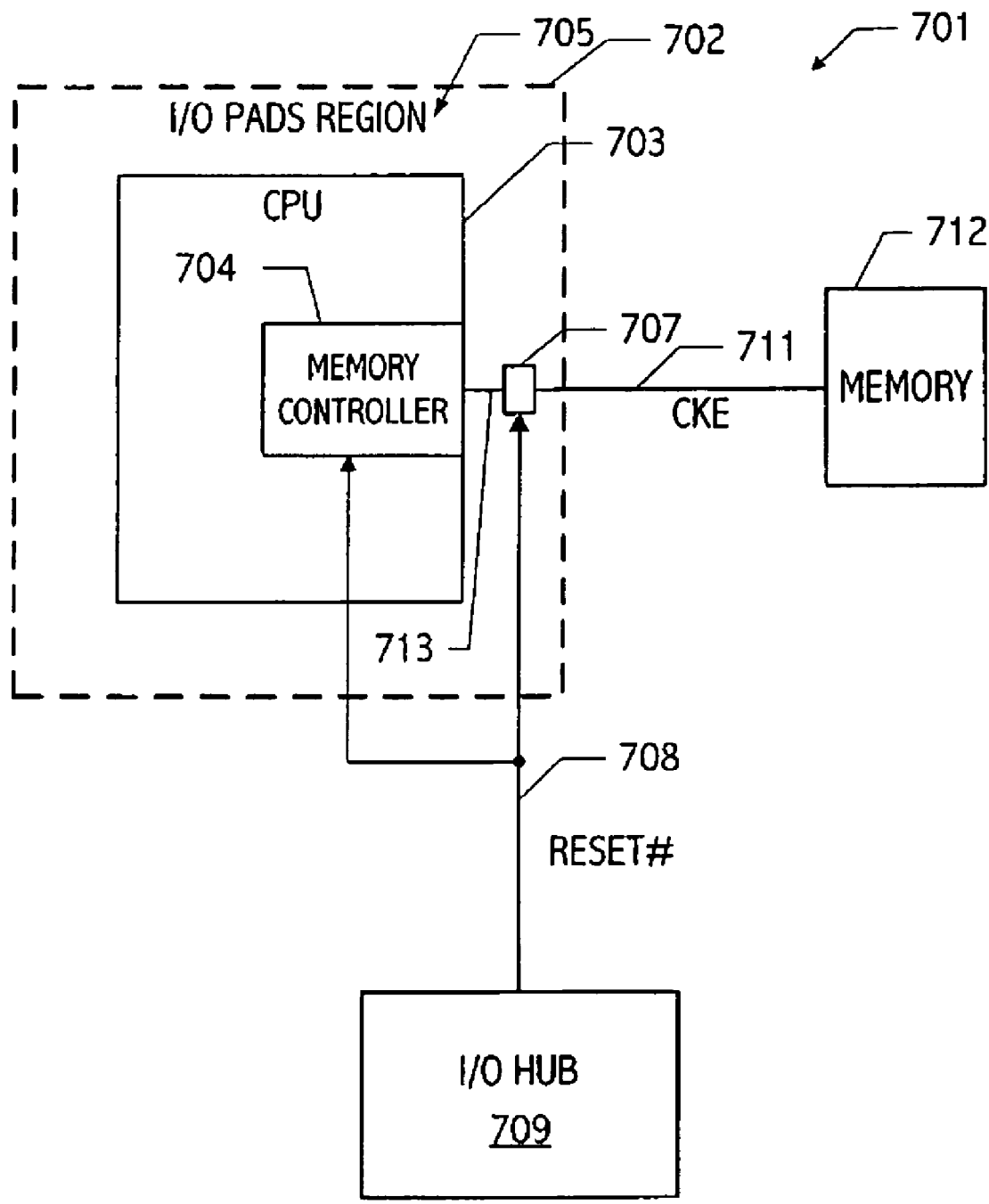
FIG. 7 illustrates an embodiment of the invention for driving the CKE signal from a separate location on the same integrated circuit during the S3 state.

In another embodiment, illustrated in FIG. 7, computer system 701 includes an integrated circuit 702 that includes CPU 703 and memory controller 704. Integrated circuit 702 includes an I/O pad region 705 that is powered separately from the CPU/memory controller core. During the S3 state, all of the core region of integrated circuit 702, including memory controller 704 is powered down. The I/O pad region 705 remains powered. The I/O pad region receives the RESET# signal 708, which in the embodiment shown, is supplied from I/O hub 709, which is an integrated circuit similar in function to the south bridge described in relation to other embodiments herein. The I/O pad region 705 includes a minimum amount of logic 707 as well as I/O drivers for the device.

In one embodiment, I/O pad region 705 receives the RESET# signal 708 from I/O hub 709. The RESET# signal is combined with the CKE signal 713 generated by memory controller 704 in logic 707 to force the CKE output 711 low when RESET# signal 708 is asserted (RESET# being active low). Thus, as the system is sequenced into S3, memory controller 704 drives the CKE signals 711 low as part of placing the memory 712 into self refresh mode. Then RESET# signal 708 is asserted, which holds CKE signal 711 low. Then power is removed from the memory controller 704. As long as RESET# signal 708 is kept asserted during the S3 state, memory 712 is maintained in the S3 state. Of course, another signal could also be used in place of RESET# signal 708. While the illustrated embodiment utilizes RESET# signal 708 as an indicator of the S3 state, another signal that is at a known state during S3 could also be used.

As computer system 701 is powered back up upon resume, power is applied, the clocks stabilize, and memory controller core 704 is initialized by RESET# such that memory controller 704 begins driving the CKE line(s) low. Thus, when RESET# is de-asserted, memory controller 704 is already holding memory 712 in self refresh mode until the BIOS software initializes the memory controller and instructs the memory controller to sequence the memory out of self refresh mode. Non volatile memory in I/O hub 709 may be used to store the memory controller configuration registers state during S3 when the memory controller is not powered.

Figure 8A:
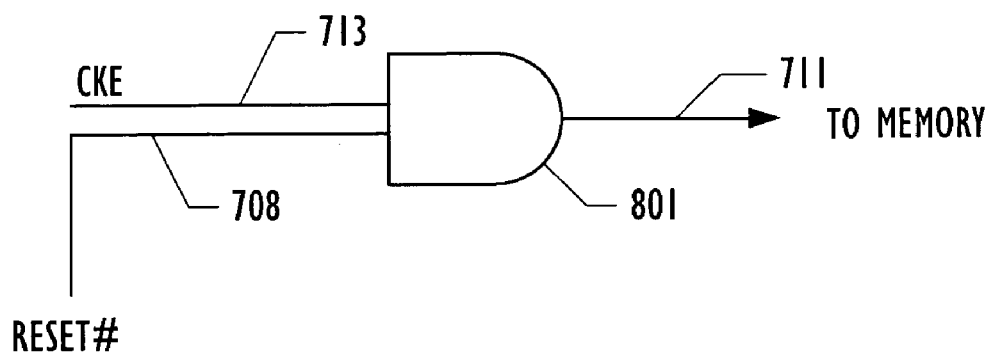
FIGS. 8A and 8B illustrate implementations of logic in the pad area to keep CKE at an appropriate logic level during the S3 state.
Figure 8B:
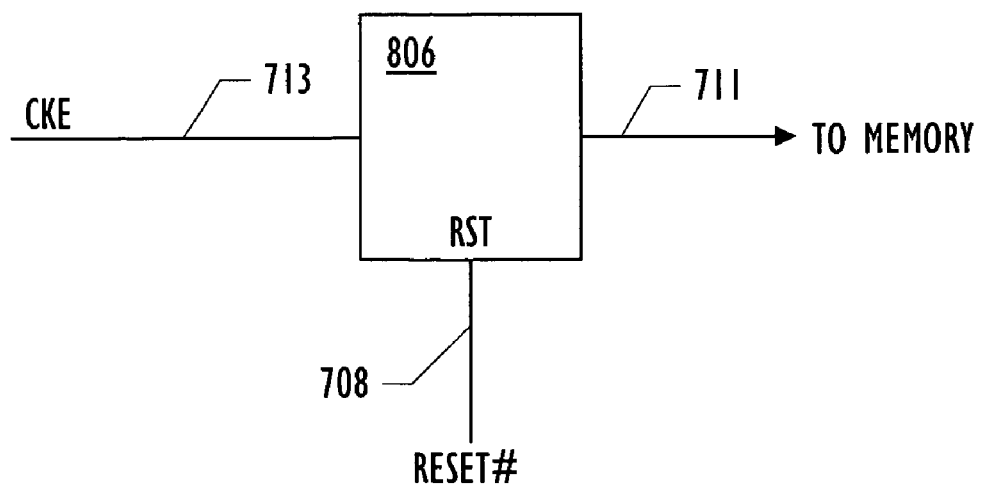

FIG. 8A depicts a simple implementation of logic 707, in which RESET# signal 708 is assumed asserted for the entire S3 state. Logic 707 includes AND gate 801 which receives CKE signal 713 output from the memory controller and RESET# signal 708. When RESET# signal 708 is not asserted, memory controller 704 controls the value of CKE 711. In another simple embodiment, illustrated in FIG. 8B, RESET# signal 708 asynchronously resets flip-flop 806, that also receives CKE 713 from memory controller 704. Such embodiments for logic 707 are exemplary. As appreciated by those of skill in the art, many other circuits can be used to perform the function of forcing CKE 711 to an appropriate value to maintain memory 712 in self refresh mode.

The description so far has primarily related to providing self refresh state for DDR DRAMS and the description has focused on maintaining CKE at an appropriate level. Other signals may be required to be held at a particular level during self refresh state in addition to or instead of CKE. For example, certain registered dual in line memory modules (DIMMs), which buffer signals prior to providing them to the DRAM device itself, also require that DDR reset be maintained asserted in addition to CKE during the self refresh state. Thus, the memory control signal maintained at a particular value may be a reset signal or another signal as required by the memory device used. In addition, the description herein has utilized DDR DRAMs as an example of memory devices capable of achieving the self refresh state and for which the invention may be advantageously used. The invention described herein may be utilized in any type of system having DRAMs that can advantageously exploit the invention.

The various embodiments described herein allow for fewer power plane partitions in the integrated circuit containing the memory controller. That provides for less complexity within the chip itself, in part by reducing or eliminating additional logic required for signals crossing power plane boundaries. In addition, having fewer power plane partitions can simplify the design for a printed circuit board on which the integrated circuit is mounted.

The description of the invention set forth herein is illustrative, and is not intended to limit the scope of the invention as set forth in the following claims. The various signals and polarities and sequences to enter and leave the self refresh state are exemplary only. In addition, the memory controller and CPU may be integrated on the same chip. Further, the power management logic may be located on a chip other than a south bridge or I/O hub. Other variations and modifications of the embodiments disclosed herein, may be made based on the description set forth herein, without departing from the scope and spirit of the invention as set forth in the following claims.

What is claimed is:

1. A method for controlling a self refresh state of memory in a computer system, comprising:
   supplying at least one memory control signal to the memory from a first integrated circuit in the computer system during an operational state;
   supplying the at least one memory control signal from another location in the computer system when the computer system is in a power savings state to maintain memory in the self refresh state; and
   wherein the first integrated circuit drives the memory control signal at a first logical level during the operational state and the other location drives the memory control signal at a high impedance level during the operational state and wherein the first integrated circuit is powered off during the power savings state and the other location drives the memory control signal at a second logical level during the power savings state to keep the memory in the self refresh state.

2. The method as recited in claim 1 wherein the first integrated circuit is completely powered off during the power savings state.

3. The method as recited in claim 1 wherein the power savings state is a suspend to RAM state.

4. The method as recited in 1 wherein the memory control signal is a clock enable signal.

5. The method as recited in 1 wherein the memory control signal is a reset signal.

6. The method as recited in claim 4 wherein the clock enable signal is low while the memory is maintained in the self refresh state.

7. A method for controlling a self refresh state of memory in a computer system, comprising:
controlling at least one memory control signal being supplied to the memory from a first integrated circuit in the computer system according to an operational state;
controlling the memory control signal from another location in the computer system when the computer system is in a power savings state to maintain memory in the self refresh state;
isolating the first integrated circuit from the memory during the power savings state; and
wherein isolating further includes disabling a switch coupling the memory control signal from the first integrated circuit to the memory by driving a switch enable signal to a first predetermined value to turn off the switch, the switch enable signal being driven from the other location; and
driving a signal line which is coupled to the switch and is coupled to the memory control signal input to the memory to a predetermined logical level from the other location, during the power savings state to control the memory control signal and wherein the signal line is driven at a high impedance by the other location during the operational state.

8. The method as recited in claim 7 further comprising driving the switch enable signal at a second predetermined value to turn on the switch during the operational state.

9. The method as recited in claim 7 wherein the other location drives the signal line coupled to the switch and coupled to the memory control signal input to the memory before the switch enable signal is driven to the first predetermined value to turn off the switch and wherein the switch enable signal is driven to the second predetermined value to turn on the switch before the other location drives the signal at high impedance.

10. A computer system comprising:
a system memory capable of operating in a self refresh state, the system memory coupled to receive at least one memory control signal required to be held at a first value during the self refresh state;
a first integrated circuit including a memory control circuit coupled to the system memory to supply the at least one memory control signal during an operational state;
a second integrated circuit, coupled to supply the at least one memory control signal at the first value during a power savings state;
an isolation circuit, external to the first and second integrated circuit, and coupled between the memory control circuit and the memory, the isolation circuit being coupled to receive the memory control signal from the memory control circuit and to selectably provide the memory control signal from the memory control circuit to the memory; and
wherein the second integrated circuit is coupled to provide a high impedance on an output terminal that is coupled to the memory control signal during an operational state of the computer system and wherein the second integrated circuit provides a logical level on the output terminal to drive the memory control signal to the first value during the power savings state.

11. The computer system as recited in claim 10 wherein the second integrated circuit is coupled to drive the output terminal and thereby the memory control signal to a low voltage level during the power savings state, the low voltage level being the first value.

12. The computer system as recited in claim 10 wherein the second integrated circuit is coupled to provide an isolation control signal to the isolation circuit during the power savings state to isolate the memory control signal provided from the memory control circuit from the memory, during the power savings state.

13. The computer system as recited in claim 10 wherein the power savings state is a suspend to RAM state wherein system context is stored in the system memory during the suspend to RAM state.

14. The computer system as recited in claim 10 wherein the first integrated circuit has multiple power planes and all the power planes are powered down during the power savings state.

15. A computer system comprising:
first means for controlling system memory during an operational state; and
second means, for controlling the system memory during a power savings state to maintain the system memory in a self refresh state when the first means is powered off, the second means including means for holding an output terminal at a high impedance during the operational state and means for providing a first logic level through the output terminal during the power savings state, the output terminal being coupled to supply a control value at the first logic level to maintain the system memory in the self refresh state when the first means is powered off; and
isolation means for isolating the first means from the system memory during the power savings state.

16. An integrated circuit of a computer system comprising:
a first output terminal supplying a memory control signal to a memory that is held at a first logic level to keep the memory in a self refresh state, the integrated circuit responsive to a first operational state of the computer system to place the output terminal at a high impedance level and responsive to a power savings state in the computer system to supply the first logic level on the output terminal; and
a second output terminal supplying a control signal for a switch external to the integrated circuit, the integrated circuit responsive to the first operational state of the computer system to place the second output terminal at a logic level causing the switch to pass through an operational memory control signal coupled to an input, of the switch as the memory control signal in the first operational state and responsive to the power savings state to supply a different logic level at the output terminal, the second logic level causing the switch to not pass through the operational memory control signal.

17. A method for controlling a self refresh state of a memory in a computer system, comprising:
controlling at least one memory control signal being supplied to the memory from a first region in an integrated circuit in the computer system during an operational state;

controlling the at least one memory control signal from another location during a power savings state in which the first region is not powered, to maintain memory in the self refresh state;

wherein the memory control signal is held at a first value to keep the memory in the self refresh state; and wherein an asserted reset signal holds the memory control signal at the first value in the first integrated circuit during the power savings state, and wherein the first region is initialized by the asserted reset signal to supply the memory control signal at the first value after the power savings state.

18. The method as recited in claim 17 wherein the power savings state is a an S3 suspend to RAM state.

19. An apparatus comprising:

a memory control circuit coupled to control at least one memory control signal during an operational state; and a second circuit coupled to cause the memory control signal to be at a logic level to maintain a memory in a self refresh state, the second circuit being operational during a power savings state in which power to the memory control circuit is turned off, wherein a reset signal coupled to the second circuit, when asserted, causes the second circuit to keep the memory control signal at the logic level to maintain the memory in a self refresh state, wherein the memory control circuit is initialized by the asserted reset signal to supply the memory control signal at the logic level to maintain the memory in a self refresh state after power to the memory control circuit is turned on following the power savings state.

20. The apparatus as recited in claim 19 wherein the memory control circuit and the second circuit are disposed on one integrated circuit.

21. The apparatus as recited in claim 20 wherein the integrated circuit includes the memory control circuit and a central processing circuit (CPU).

* * * * *